(12) United States Patent
Hu et al.

(10) Patent No.: US 10,101,621 B2
(45) Date of Patent: Oct. 16, 2018

(54) DISPLAY SUBSTRATE AND MANUFACTURING METHOD THEREOF, DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Haichen Hu, Beijing (CN); Su Min, Beijing (CN); Jinwei Shi, Beijing (CN); Donghui Qi, Beijing (CN); Shuai Hou, Beijing (CN); Liping Luo, Beijing (CN); Zengbiao Sun, Beijing (CN); Tao Wang, Beijing (CN)

(73) Assignees: BOE TECHNOLOGY GROUP CO., LTD., Beijing (CN); BEIJING BOE TECHNOLOGY CO., LTD., Beijing (CN)

( * ) Notice: Subject to any disclaimer, the term of this patent is extended or adjusted under 35 U.S.C. 154(b) by 10 days.

(21) Appl. No.: 15/268,880

(22) Filed: Sep. 19, 2016

(65) Prior Publication Data

US 2017/0102594 A1 Apr. 13, 2017

(30) Foreign Application Priority Data

Oct. 12, 2015 (CN) .......................... 2015 1 0657458

(51) Int. Cl.
*H01L 29/04* (2006.01)
*H01L 29/10* (2006.01)
(Continued)

(52) U.S. Cl.
CPC ...... *G02F 1/136204* (2013.01); *G02F 1/1368* (2013.01); *G02F 1/136286* (2013.01);
(Continued)

(58) Field of Classification Search
CPC ......... G02F 1/136204; G02F 1/136286; G02F 1/1368; G02F 2201/121; G02F 1/1362;
(Continued)

(56) References Cited

U.S. PATENT DOCUMENTS

| 2006/0266544 A1 | 11/2006 | Tung et al. |
| 2012/0242919 A1 | 9/2012 | Wang et al. |
| 2015/0255449 A1* | 9/2015 | Kim ................. G02F 1/136204 349/40 |

FOREIGN PATENT DOCUMENTS

| CN | 1766722 A | 5/2006 |
| CN | 101236315 A | 8/2008 |
(Continued)

OTHER PUBLICATIONS

The First Chinese Office Action dated Sep. 15, 2017; Appln. 201510657458.9.

*Primary Examiner* — Charles Garber
*Assistant Examiner* — Abdulfattah Mustapha
(74) *Attorney, Agent, or Firm* — Ladas & Parry LLP

(57) ABSTRACT

A display substrate and a display device are provided. The display substrate includes: plural gate lines each having at least one end provided with plural first electrostatic discharge (ESD) units configured to discharge static electricity in the gate lines. The plural first ESD units have curvatures different from each other. By discharging the static electricity through the plural ESD units, in case one of the ESD units is broken down by electrostatic current, the other ones can continue working.

19 Claims, 7 Drawing Sheets

(51) Int. Cl.
    *H01L 31/036*     (2006.01)
    *G02F 1/1362*     (2006.01)
    *G02F 1/1368*     (2006.01)
    *H01L 27/12*     (2006.01)
    *H01L 27/02*     (2006.01)

(52) U.S. Cl.
    CPC ........ *H01L 27/0288* (2013.01); *H01L 27/124* (2013.01); *H01L 27/1262* (2013.01); *G02F 2201/121* (2013.01)

(58) Field of Classification Search
    CPC ............. H01L 27/124; H01L 127/1262; H01L 27/0288; H01L 27/12
    See application file for complete search history.

(56) References Cited

FOREIGN PATENT DOCUMENTS

| | | |
|---|---|---|
| CN | 202049314 U | 11/2011 |
| CN | 103091922 A | 5/2013 |
| JP | 2002-202521 A | 7/2002 |
| TW | 200642531 A | 12/2006 |

\* cited by examiner

DISPLAY SUBSTRATE AND MANUFACTURING METHOD THEREOF, DISPLAY DEVICE

TECHNICAL FIELD

Embodiments of the present disclosure relate to a display substrate, a manufacturing method thereof, and a display device.

BACKGROUND

In an array substrate of a liquid crystal display (LCD) panel, an electrostatic discharge (ESD) unit is disposed in order to avoid occurrence of electrostatic breakdown of the array substrate due to excessively large static electricity generated during manufacturing process and subsequent usage, so as to avoid destroying a TFT structure of the array substrate which may lead to abnormal display.

SUMMARY

According to the embodiments of the present disclosure, a display substrate is provided, including: plural gate lines each having at least one end provided with plural first electrostatic discharge (ESD) units configured to discharge static electricity in the gate lines. The plural first ESD units have curvatures different from each other.

For example, the display substrate further includes: plural first electrostatic induction (ESI) units corresponding to the first ESD units respectively, being configured to receive the static electricity discharged by the first ESD units.

For example, the display substrate further includes: at least one first common electrode line in parallel to data lines; plural first thin film transistors (TFTs) each corresponding to one of the gate lines. Each of the first TFTs has a drain connected to the first common electrode line, and a source and a gate both connected to the corresponding gate line.

For example, the plural first ESD units are disposed at two sides of each end of each of the gate lines along an axial line of the gate line, respectively.

For example, the curvatures of the first ESD units disposed at one end of each of the gate lines are progressively increased along a direction from a middle point of the gate line to the end of the gate line.

For example, the display substrate further includes plural data lines each having at least one end provided with plural second ESD units configured to discharge static electricity in the data lines. The plural second ESD units have curvatures different from each other.

For example, the display substrate further includes: plural second ESI units corresponding to the plural second ESD units, respectively, being configured to receive the static electricity discharged by the second ESD units.

For example, the display substrate further includes: at least one second common electrode line in parallel to the gate lines; plural second TFTs each corresponding to one of the data lines. Each of the second TFTs has a drain connected to the second common electrode line, and a source and a gate both connected to the corresponding data line.

For example, the plural second ESD units are disposed at two sides of each end of each of the data lines along an axial line of the data line, respectively.

For example, the curvatures of the plural second ESD units disposed at one end of each of the data lines are progressively increased along a direction from a middle point of the data line to the end of the data line.

Embodiments of the present disclosure also provide a display device including the display substrate.

Embodiments of the present disclosure also provide a manufacturing method of the display substrate, including: forming plural gate lines on a substrate and meanwhile forming plural first ESD units at least one end of each of the gate lines so as to discharge static electricity in the gate lines; forming plural data lines on a gate insulating layer and meanwhile forming plural second ESD units at least one end of each of the data lines so as to discharge static electricity in the data lines. The plural first ESD units have curvatures different from each other, and the plural second ESD units have curvatures different from each other.

For example, the manufacturing method further includes: at the time of forming the gate lines, forming plural first ESI units on the substrate to be corresponding to the first ESD units respectively, so as to receive the static electricity discharged by the first ESD units; at the time of forming the data lines, forming plural second ESI units on the gate insulating layer to be corresponding to the second ESD units respectively, so as to receive the static electricity discharged by the second ESD units.

According to the technical solutions, by discharging the static electricity through the plural ESD units, in case one of the ESD units is broken down by electrostatic current, the other ones can continue working normally. Moreover, the plural ESD units have curvatures different from each other, and hence can be broken down one by one under larger electrostatic current so that the number of times of the ESD units discharging the static electricity is increased, which allows a good effect of electrostatic discharge.

BRIEF DESCRIPTION OF THE DRAWINGS

Embodiments of the present disclosure will be illustrated in more details in connection with the drawings so as to enable those skilled in the art to understand the disclosure more clearly, in which.

DETAILED DESCRIPTION

Figure 1:
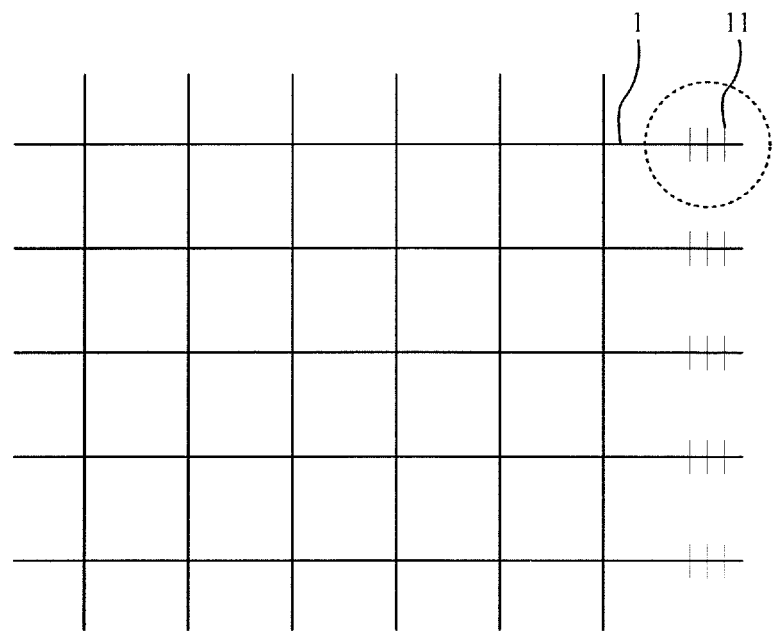
FIG. 1 is a schematically structural diagram illustrating a display substrate according to an embodiment of the present disclosure.

Technical solutions according to the embodiments of the present disclosure will be described in details as below in conjunction with the accompanying drawings of embodiments of the present disclosure. It is apparent that the described embodiments are only part of but not all of exemplary embodiments of the present disclosure. Based on the described embodiments of the present disclosure, various other embodiments can be obtained by those of ordinary skill in the art without creative labor and those embodiments shall fall into the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

It should be explained that the embodiments of the present disclosure as well as the features described therein can be combined with each other unless they are conflicted.

An electrostatic discharge (ESD) structure disposed in a substrate of a liquid crystal display (LCD) utilizes a principle of point discharge that under a strong electric field, a tip of an object will have intensive power lines which may easily result in the electric discharge phenomena. As a result, it disposes two sharp-angular structural units on the substrate at small distance there-between, one of the two sharp-angular structural units is connected to an element to be protected on an array substrate while the other one is connected to a common electrode line or is grounded. When the static electricity is generated, electric charges on the array substrate will be discharged to the common electrode line having a larger area or be guided to the ground through the two sharp-angular structural units.

The inventor of the present disclosure noticed that the sharp-angular structural unit connected to the common electrode line or being grounded can be manufactured into a separated metallic unit for use as an electrostatic discharge induction unit which discharges electrostatic energy by inducing an occurrence of breakdown. However, such structure will lose the capacity of induction once one breakdown happens, and it can no longer have the function of protection against the subsequently generated static electricity.

In the following description, many details are set forth for purpose of facilitating sufficient understanding of the embodiments of the present disclosure, but the embodiments of the present disclosure can be implemented by other ways different from those described herein, and the scope of the present disclosure will not be limited to the illustrative embodiments as disclosed below.

Figure 2:
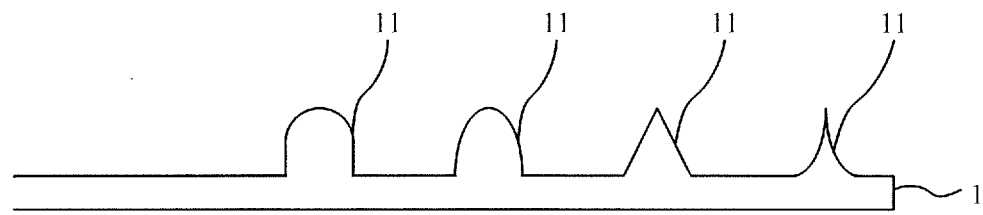
FIG. 2 is an enlarged view of a portion indicated by dotted lines in FIG. 1.

As illustrated in FIG. 1 and FIG. 2, a display substrate according to an embodiment of the present disclosure includes: plural gate lines 1 each having at least one end provided with plural first electrostatic discharge (ESD) units 11 configured to discharge static electricity in the gate lines 1.

The plural ESD units 11 have curvatures different from each other.

In the present embodiment, by discharging the static electricity in the gate lines through the plural ESD units respectively, in case one of the ESD units is broken down by electrostatic current, other ones can continue working normally. Moreover, the plural ESD units 11 have curvatures different from each other, and they can be broken down one by one under relatively larger electrostatic current, rather than being broken down all at once. For example, FIG. 2 illustrates 4 first ESD units 11, of which the curvatures are progressively increased along a direction from a middle point of the gate line to a distal end of the gate line, wherein the first ESD unit 11 closest to the distal end of the gate line has the maximum curvature and will be broken down first under relatively large electrostatic current, while the other first ESD units 11 can continue working normally. In this way, the number of times of the first ESD units 11 discharging the static electricity can be increased and a good effect of electrostatic discharge of the gate lines 1 can be provided.

It should be explained that the drawings merely illustrate the first ESD units disposed at one end of the gate line 1, although in other embodiments both ends of the gate line 1 can be provided with the ESD units 11.

Figure 3:
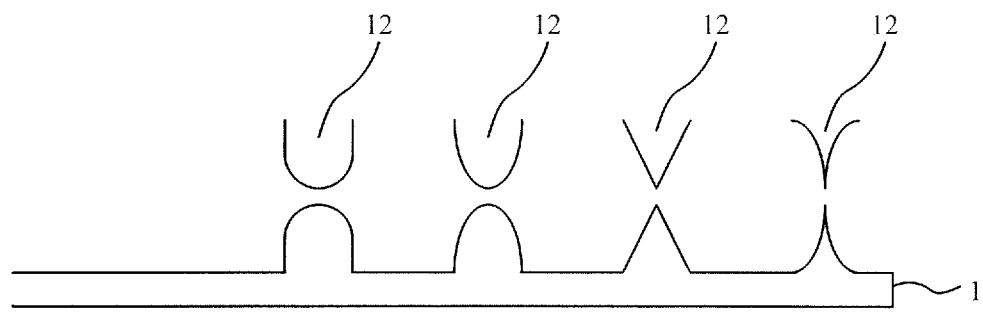
FIG. 3 is a schematically structural diagram illustrating a first ESI unit according to an embodiment of the present disclosure.

As illustrated in FIG. 3, for example, the display substrate further includes plural first electrostatic induction (ESI) units 12 corresponding to the plural first ESD units 11 respectively, being configured to receive the static electricity discharged by the first ESD unit 11, wherein the first ESI unit 12 can be disposed on a layer structure where the gate lines are located, for example, when the gate lines are disposed on a glass substrate, the first ESI unit 12 can also be disposed on the glass substrate, and a shape of the first ESI unit 12 can be corresponding to a shape of the first ESD unit 11.

By disposing the first ESI units 12 to be corresponding to the first ESD units 11 respectively, the static electricity in the first ESD units 11 can be quickly discharged so as to decrease the time for the electrostatic charges to be accumulated in the first ESD units 11. In this way, it can prevent the first ESD units 11 from being meltdown due to heat resulted from a turbulent current generated by the electrostatic charges.

Figure 4:
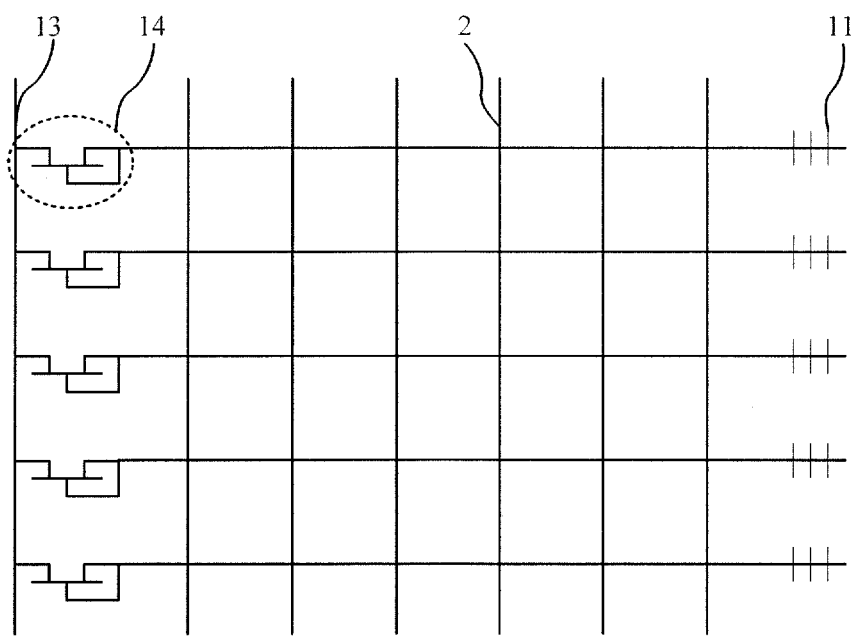
FIG. 4 is a schematically structural diagram illustrating a first common electrode line according to an embodiment of the present disclosure.

As illustrated in FIG. 4, for example, the display substrate further includes: at least one first common electrode line 13 parallel to data lines 2; plural first thin film transistors (TFTs) 14 each corresponding to one of the gate lines.

The first TFT 14 has a drain connected to the first common electrode line 13, and a source and a gate both connected to the corresponding gate line 1.

When the electrostatic charges in the gate line 1 cannot be discharged, for example, when the first ESD units 11 are all broken down, the electrostatic charges in the gate line 1 can be transported to the gate of the first TFT 14 to switch on the TFT 14 and then be transported to the first common electrode line 13 through the source and the drain of the first TFT 14, so as to complete the electrostatic discharge process and further provide a good effect of electrostatic discharge of the gate line 1.

Figure 5:
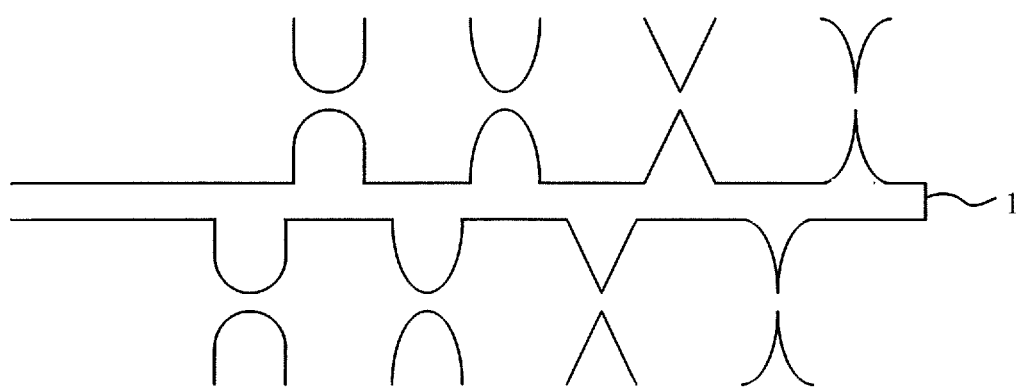
FIG. 5 is a schematically structural diagram illustrating a gate line according to an embodiment of the present disclosure.

As illustrated in FIG. 5, for example, plural first ESD units 11 are disposed at two sides of each end of each of the gate lines 1 along an axial line of the gate line 1, respectively. By disposing the first ESD units 11 at both sides of the axial line of the gate line 1 respectively, quick electrostatic discharge can be realized. The first ESD units 11 located at one side can be disposed to be not corresponding to those located at the other side so that the positions where the electrostatic discharge will be occurred are arranged in a stagger manner, so that the first ESD units 11 can be broken down one by one.

For example, the curvatures of the first ESD units 11 located at one end of the gate line 1 are progressively increased along a direction from a middle point of the gate line to the end of the gate line.

Due to the principle of point discharge, the static electricity is liable to be accumulated at two ends of the gate line 1, it can be arranged to allow the first ESD unit 11 closer to an end point of the gate line 1 having a larger curvature (being more sharp) and hence being more likely to accumulate electrostatic charges; in this way, more electrostatic charges closer to the end point can be discharged.

Figure 6:
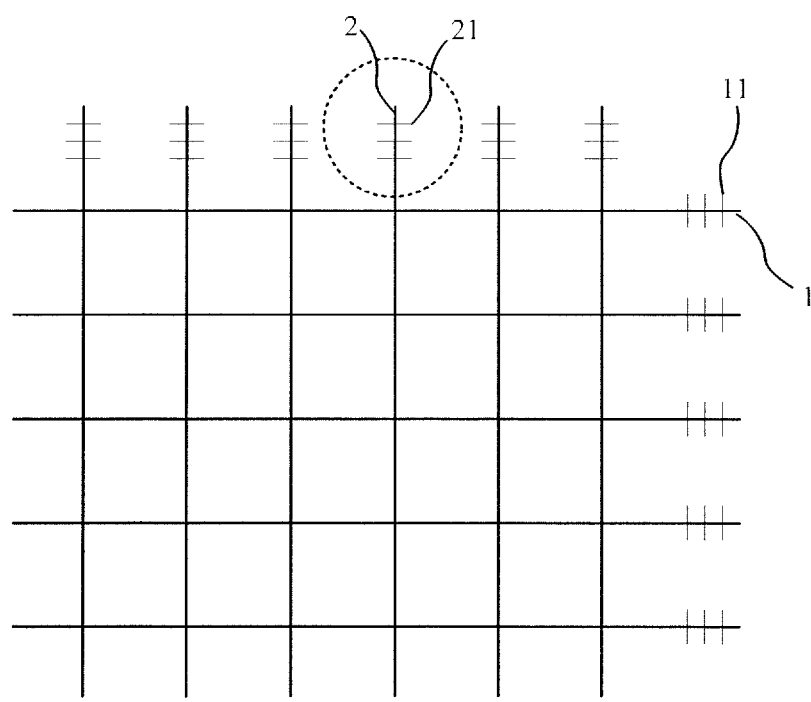
FIG. 6 is a schematically structural diagram illustrating a display substrate according to another embodiment of the present disclosure.
Figure 7:
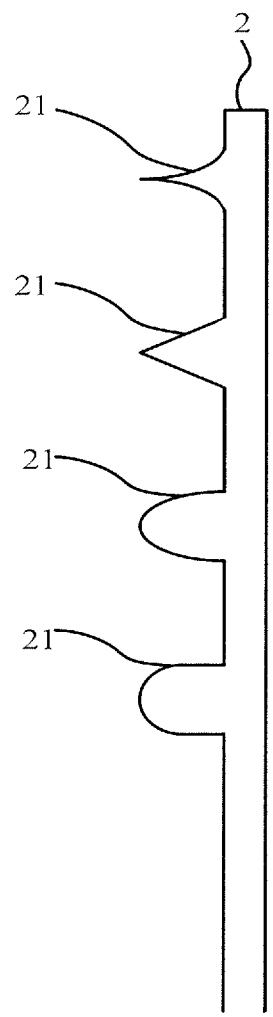
FIG. 7 is an enlarged view of a portion indicated by dotted lines in FIG. 6.

As illustrated in FIG. 6 and FIG. 7, for example, the display substrate further includes: plural data lines 2 each having at least one end provided with plural second ESD units 21 configured to discharge the static electricity in the data lines 2.

The plural second ESD units 21 have curvatures different from each other.

In the present embodiment, by discharging the static electricity in the data lines through the plural second ESD units 21 respectively, in case one of the second ESD units 21 is broken down by electrostatic current, the other ones can continue working normally. Moreover, the plural second ESD units 21 have curvatures different from each other, and they can be broken down one by one under relatively larger electrostatic current so that the number of times of the second ESD units 21 discharging the static electricity is increased, which allows a good effect of electrostatic discharge of the data lines 2.

It should be explained that the drawings merely illustrate the second ESD units 21 disposed at one end of the data line 2, although in other embodiments both ends of the data line 2 can be provided with the second ESD units 21. A shape and an arrangement of the second ESD unit 21 can be similar to that of the first ESD unit 11, which are not repeated in detail herein.

Figure 8:
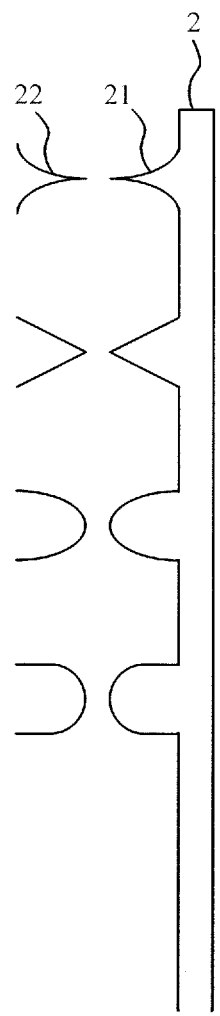
FIG. 8 is a schematically structural diagram illustrating a second ESI unit according to an embodiment of the present disclosure.

As illustrated in FIG. 8, for example, the display substrate further includes: plural second ESI units 22 corresponding to the second ESD units 21 respectively, being configured to receive the static electricity discharged by the second ESD units 21.

The second ESI units 22 are disposed to be corresponding to the second ESD units 21 so as to allow quick electrostatic discharge in the second ESD units 21 and to decrease the time for the electrostatic charges to be accumulated in the second ESD units 21. In this way, it can prevent the second ESD units 21 from being meltdown due to heat resulted from a turbulent current generated by the electrostatic charges.

Figure 9:
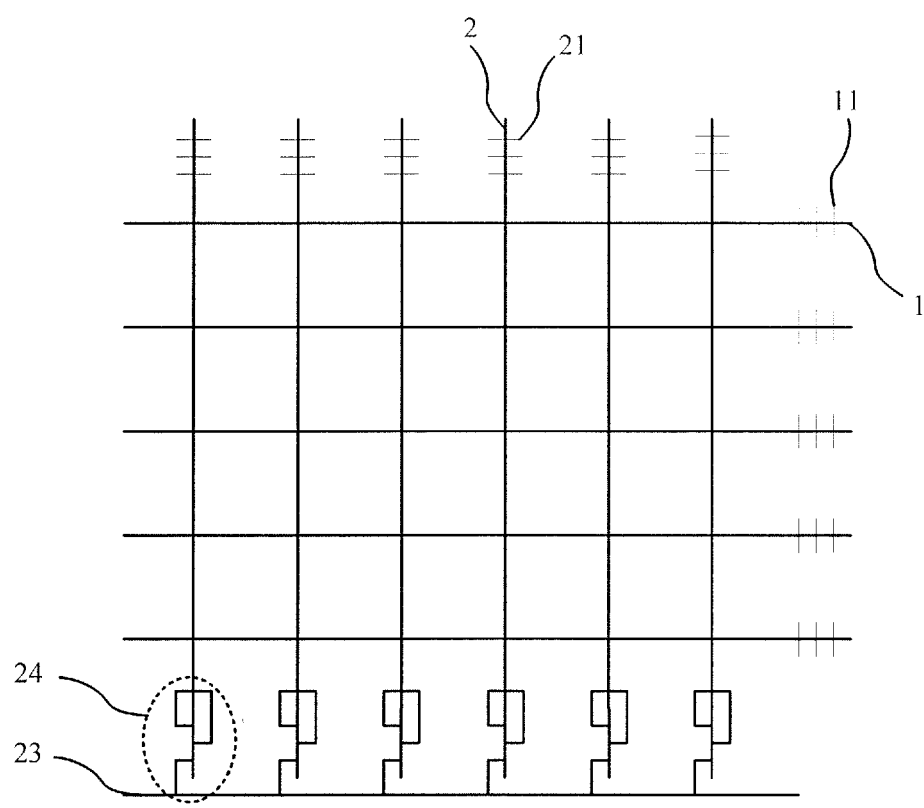
FIG. 9 is a schematically structural diagram illustrating a second common electrode line according to an embodiment of the present disclosure.

As illustrated in FIG. 9, for example, the display substrate further includes: at least one second common electrode line 23 parallel to the gate lines 1; plural second TFTs 24 each corresponding to one of the data lines 2.

The second TFT 24 has a drain connected to the second common electrode line 23, and a source and a gate both connected to the corresponding data line.

When the electrostatic charges in the data line 2 cannot be discharged, for example, when the second ESD units 21 are all broken down, the electrostatic charges in the data line 2 can be transported to the gate of the second TFT 24 to switch on the second TFT 24 and then be transported to the second common electrode line 23 through the source and the drain of the second TFT 24, so as to complete the electrostatic discharge process and further allow a good effect of electrostatic discharge of the data line 2.

Figure 10:
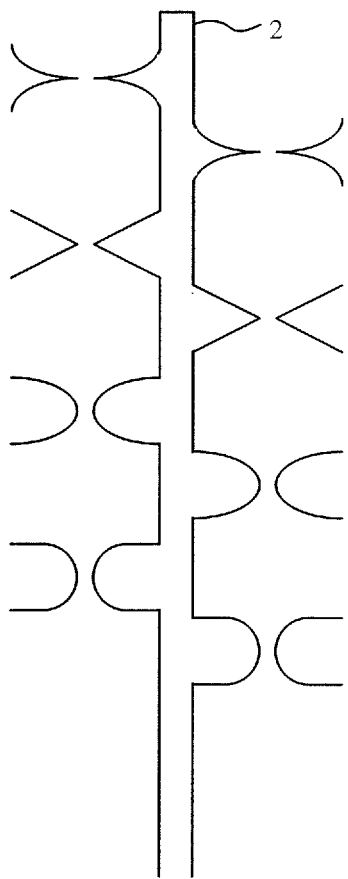
FIG. 10 is a schematically structural diagram illustrating a data line according to an embodiment of the present disclosure.

As illustrated in FIG. 10, for example, plural second ESD units 21 are disposed at two sides of each end of each of the data lines 2 along an axial line of the data line 2, respectively. By disposing the second ESD units 21 at both sides of the axial line of the data line 2, quick electrostatic charge can be realized.

For example, the curvatures of the second ESD units 21 located at one end of the data line 2 are progressively increased along a direction from a middle point of the data line to the end of the data line.

Due to the principle of point discharge, the static electricity is liable to be accumulated at two ends of the data line 2, thus it can be arranged to allow the second ESD unit 21 closer to an end point having a larger curvature (being more sharp) and hence it can be more likely to accumulate electrostatic charges; in this way, more electrostatic charges closer to the end point can be discharged.

Embodiments of the present disclosure also provide a display device including the display substrate.

It should be explained that the display device in the present embodiment can be any products or components having display function, such as digital paper, mobile phone, tablet computer, television, notebook computer, digital photo frame and navigator.

Figure 11:
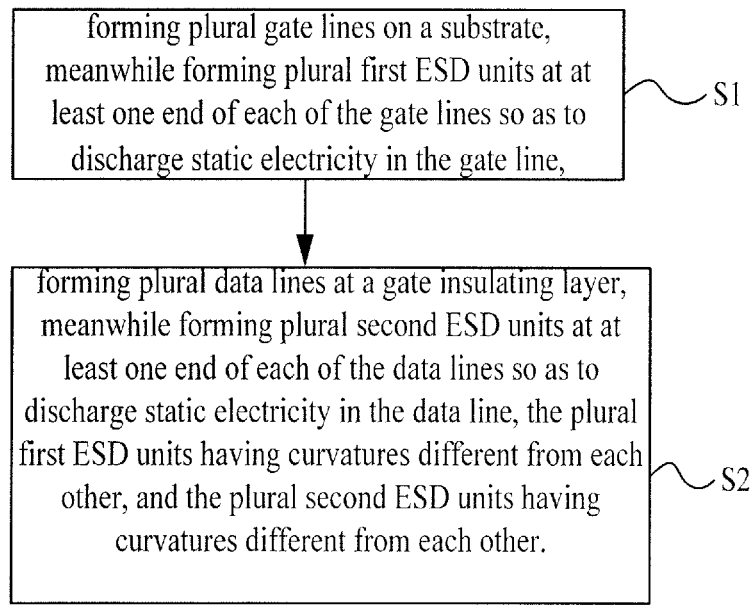
FIG. 11 is a flow chart illustrating a manufacturing method of a display substrate according to an embodiment of the present disclosure.

As illustrated in FIG. 11, embodiments of the present disclosure also provide a manufacturing method of the display substrate, including:

S1, forming plural gate lines on a substrate, meanwhile forming plural first ESD units at least one end of each of the gate lines so as to discharge static electricity in the gate lines; and S2, forming plural data lines at a gate insulating layer, meanwhile forming plural second ESD units at least one end of each of the data lines so as to discharge static electricity in the data lines.

The plural first ESD units have curvatures different from each other, and the plural second ESD units have curvatures different from each other.

For example, the manufacturing method further includes: at the time of forming the gate lines, forming plural first ESI units on the substrate to be corresponding to the first ESD units respectively so as to receive the static electricity discharged by the first ESD units.

At the time of forming the data lines, forming plural second ESI units on the gate insulating layer to be corresponding to the second ESD units respectively so as to receive the static electricity discharged by the second ESD units. Forming the ESI units and the ESD units on a same layer can simplify the manufacturing process.

The above-mentioned process can utilize various manufacturing processes including film forming processes, such as depositing and sputtering, and patterning processes, such as etching.

As above, technical solutions of the embodiments of the present disclosure are described in details with reference to the accompany drawings. According to the technical solutions of the embodiments of the present disclosure, by discharging the static electricity through plural ESD units, in case one of the ESD units is broken down by electrostatic current, the other ones can continue working normally. Moreover, the plural ESI units have curvatures different from each other, and they can be broken down one by one under relatively larger electrostatic current so that the number of times of the ESD units discharging the static electricity is increased, which allows a good effect of electrostatic discharge.

The foregoing are merely exemplary embodiments of the present disclosure, but not limitative to the disclosure. For a person of ordinary skill in the art, various modifications and improvements can be made without departing from the principle and spirit of the present disclosure, and all of which shall fall within the scope of the present disclosure.

The present application claims the benefits and priority of Chinese patent application No. 201510657458.9 filed on Oct. 12, 2015 and entitled "Display Substrate and the Manufacturing Method Thereof and Display Device," which is incorporated in entirety herein by reference.

What is claimed is:

1. A display substrate, comprising:
   plural gate lines each having at least one end provided with plural first electrostatic discharge (ESD) units configured to discharge static electricity in the gate lines,
   wherein the plural first ESD units have curvatures different from each other.

2. The display substrate according to claim 1, further comprising:
   plural first electrostatic induction (ESI) units corresponding to the first ESD units respectively, being configured to receive the static electricity discharged by the first ESD units.

3. The display substrate according to claim 1, further comprising:
   at least one first common electrode line parallel to data lines;
   plural first thin film transistors (TFTs) each corresponding to one of the gate lines,
   wherein each of the first TFTs has a drain connected to the first common electrode line, and a source and a gate both connected to the corresponding gate line.

4. The display substrate according to claim 1, wherein the plural first ESD units are disposed at two sides of each end of each of the gate lines along an axial line of the gate line, respectively.

5. The display substrate according to claim 1, wherein the curvatures of the first ESD units disposed at one end of each of the gate ones are progressively increased along a direction from a middle point of the gate line to the end of the gate line.

6. The display substrate according to claim 1 further comprising:
   plural data lines each having at least one end provided with plural second ESD units configured to discharge static electricity in the data lines,
   wherein the plural second ESD units have curvatures different from each other.

7. The display substrate according to claim 6, further comprising:
   plural second ESI units corresponding to the plural second ESD units respectively, being configured to receive the static electricity discharged by the second ESD units.

8. The display substrate according to claim 6, further comprising:
   at least one second common electrode line parallel to the gate lines;
   plural second TFTs each corresponding to one of the data lines,
   wherein each of the second TFTs has a drain connected to the second common electrode line, and a source and a gate both connected to the corresponding data line.

9. The display substrate according to claim 6, wherein the plural second ESD units are disposed at two sides of each end of each of the data lines along an axial line of the data line, respectively.

10. The display substrate according to claim 6, wherein the curvatures of the plural second ESD units disposed at one end of each of the data lines are progressively increased along a direction from a middle point of the data line to the end of the data line.

11. A display device, comprising a display substrate, wherein the display substrate comprises:
    plural gate lines each having at least one end provided with plural first electrostatic discharge (ESD) units configured to discharge static electricity in the gate lines,
    wherein the plural first ESD units have curvatures different from each other.

12. A manufacturing method of the display substrate according to claim 1, comprising:
    forming the plural gate lines on a substrate, simultaneously forming the plural first electrostatic discharge (ESD) units at at least one end of each of the gate lines to discharge static electricity in the gate lines;
    wherein the plural first ESD units have curvatures different from each other.

13. The manufacturing method according to claim 12, comprising:
    forming plural data lines on a gate insulating layer, meanwhile forming plural second ESD units at at least one end of each of the data lines to discharge static electricity in the data lines;
    wherein the plural second ESD units have curvatures different from each other.

14. The manufacturing method according to claim 12, further comprising:
    at the time of forming the gate lines, forming plural first electrostatic induction (ESI) units on the substrate to be corresponding to the first ESD units respectively, to receive the static electricity discharged by the first ESD units.

15. The manufacturing method according to claim 13, further comprising:
    at the time of forming the data lines, forming plural second ESI units on the gate insulating layer to be corresponding to the second ESD units respectively, to receive the static electricity discharged by the second ESD units.

16. The display substrate according to claim 2, further comprising:
    at least one first common electrode line parallel to data lines;
    plural first thin film transistors (TFTs) each corresponding to one of the gate lines,
    wherein each of the first TFTs has a drain connected to the first common electrode line, and a source and a gate both connected to the corresponding gate line.

17. The display substrate according to claim 2, wherein the plural first ESD units are disposed at two sides of each end of each of the gate lines along an axial line of the gate line, respectively.

18. The display substrate according to claim 2, further comprising:
    plural data lines each having at least one end provided with plural second ESD units configured to discharge static electricity in the data lines,
    wherein the plural second ESD units have curvatures different from each other.

19. The display substrate according to claim 18, wherein the plural first ESD units are disposed at two sides of each end of each of the gate lines along an axial line of the gate line, respectively.

* * * * *